(12) United States Patent
Wu et al.

(10) Patent No.: US 11,490,540 B2
(45) Date of Patent: Nov. 1, 2022

(54) POWER DEVICE AND SERVER

(71) Applicant: Wistron Corporation, New Taipei (TW)

(72) Inventors: Yu-Jian Wu, New Taipei (TW); Zhi-Tao Yu, New Taipei (TW); Wei Lin, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 17/164,799

(22) Filed: Feb. 1, 2021

(65) Prior Publication Data

US 2022/0192046 A1    Jun. 16, 2022

(30) Foreign Application Priority Data

Dec. 11, 2020 (CN) .......................... 202011448881.5

(51) Int. Cl.
 *H05K 7/14*   (2006.01)
 *H05K 5/02*   (2006.01)
 *G06F 1/26*   (2006.01)

(52) U.S. Cl.
 CPC ............ *H05K 7/1492* (2013.01); *G06F 1/26* (2013.01); *H05K 5/023* (2013.01); *H05K 5/0221* (2013.01); *H05K 7/1489* (2013.01)

(58) Field of Classification Search
 CPC .... H05K 7/1492; H05K 5/0221; H05K 5/023; H05K 7/1489; G06F 1/26
 See application file for complete search history.

(56) References Cited

U.S. PATENT DOCUMENTS

| 9,720,460 | B2 | 8/2017 | Ganta |
| 10,568,238 | B1 * | 2/2020 | Leung ................. H05K 7/20736 |
| 2014/0003010 | A1 | 1/2014 | Lee et al. |
| 2017/0017276 | A1 | 1/2017 | Ganta |
| 2019/0075667 | A1 * | 3/2019 | Ehlen ................... H05K 5/0239 |

FOREIGN PATENT DOCUMENTS

| TW | 201401978 | 1/2014 |
| TW | 201607409 | 2/2016 |

OTHER PUBLICATIONS

"Office Action of Taiwan Counterpart Application", dated Dec. 1, 2021, p. 1-p. 7.

* cited by examiner

*Primary Examiner* — James Wu
*Assistant Examiner* — Hung Q Dang
(74) *Attorney, Agent, or Firm* — JCIPRNET

(57) ABSTRACT

A power device, including a box body, a power distribution module, at least one power supply module, a handle and a locking member, is provided. The power distribution module is detachably disposed on the box body. The power supply module is detachably disposed on the box body and detachably connected to the power distribution module. The handle is rotatably connected to the power distribution module and adapted to detachably connect the power distribution module to the box body. The locking member is movably disposed on the box body and is adapted to cooperate with the handle to position the power supply module. In addition, a server including the power device is also provided.

20 Claims, 19 Drawing Sheets

POWER DEVICE AND SERVER

CROSS-REFERENCE TO RELATED APPLICATION

This application claims the priority benefit of China application serial no. 202011448881.5, filed on Dec. 11, 2020. The entirety of the above-mentioned patent application is hereby incorporated by reference herein and made a part of this specification.

BACKGROUND

Technical Field

The disclosure relates to a power device and a server having the power device, and more particularly to a power device including a power distribution module and a server having the power device.

Description of Related Art

With the continuous improvement of server performance, sufficient and stable power supply is increasingly important to the server. Therefore, the power devices of some servers include multiple power supply modules, and is provided with a power distribution module to distribute the power. In such configuration, multiple power supply modules are respectively inserted into the power distribution module, and the power distribution module is inserted into the main board of the server. Accordingly, each of the power supply modules supplies power to the server through the power distribution module. However, the inserting direction in which the power supply modules are inserted into the power distribution module is usually different from the detaching direction of the power distribution module. Therefore, when the user directly detaches the power distribution module without detaching the power supply modules beforehand, the bonding structure between the power supply modules and the power distribution module may be easily damaged due to the forced movement of the power distribution module.

SUMMARY

The disclosure provides a power device and a server, which prevents a bonding structure between a power supply module and a power distribution module from being damaged.

A power device of the disclosure includes a box body, a power distribution module, at least one power supply module, a handle, and a locking member. The power distribution module is detachably disposed on the box body. The power supply module is detachably disposed on the box body and detachably connected to the power distribution module. The handle is rotatably connected to the power distribution module and adapted to detachably connect the power distribution module to the box body. The locking member is movably disposed on the box body and adapted to cooperate with the handle to position the power supply module.

A server of the disclosure includes a server body and a power device. The power device includes a box body, a power distribution module, at least one power supply module, a handle, and a locking member. The box body is disposed on the server body. The power distribution module is detachably disposed on the box body. The power supply module is detachably disposed on the box body and detachably connected to the power distribution module. The handle is rotatably connected to the power distribution module and adapted to detachably connect the power distribution module to the box body. The locking member is movably disposed on the box body and adapted to cooperate with the handle to position the power supply module.

In an embodiment of the disclosure, the handle is actuated from a first state to a second state to drive the power distribution module to be connected to the box body. The locking member is reset to a first position after the handle pushes the locking member from the first position to a second position.

In an embodiment of the disclosure, the handle is actuated from a first state to a second state to drive the power distribution module to be connected to the box body. The handle pushes the locking member from a first position to a second position to position the power supply module.

In an embodiment of the disclosure, the power device further includes an elastic member. The elastic member connects the locking member to the box body, and the locking member is adapted to be reset from the second position to the first position by elastic force of the elastic member.

In an embodiment of the disclosure, the elastic member is a spring and is connected between the box body and the locking member.

In an embodiment of the disclosure, the elastic member is an elastic arm and is connected to an end of the locking member.

In an embodiment of the disclosure, the locking member has at least one positioning convex portion. The at least one power supply module has a positioning concave portion. The at least one positioning convex portion of the locking member is adapted to extend toward an inside of the box body and be positioned on the positioning concave portion of the at least one power supply module.

In an embodiment of the disclosure, the positioning convex portion cooperates with the box body to prevent the locking member to be separated from the box body.

In an embodiment of the disclosure, the box body has at least one pillar portion. The handle has at least one hooking portion and at least one pushing portion. The at least one pushing portion is adapted to push the at least one pillar portion, so that the at least one hooking portion is hooked with the at least one pillar portion to position the power distribution module to the box body.

In an embodiment of the disclosure, the pushing portion has an arc-shaped edge and is adapted to push the at least one pillar portion by the arc-shaped edge.

In an embodiment of the disclosure, a guiding slot is formed between the hooking portion and at least a portion of the arc-shaped edge. The hooking portion is adapted to be hooked with the pillar portion by the guiding slot.

Based on the above, according to the embodiments of the disclosure, the handle adapted to detach the power distribution module is disposed on the power distribution module of the power device, and the locking member adapted to lock the handle is correspondingly disposed on the box body. Under the condition that the power supply module is disposed on the box body, the locking member is positioned by the power supply module and cannot be moved. Therefore, even if the user applies force to the handle, the handle remains not actuatable due to the locking of the locking member. Consequently, the power distribution module can be prevented from being moved to damage the bonding structure between the power supply module and the power distribution module.

DETAILED DESCRIPTION OF DISCLOSED EMBODIMENTS

Figure 1:
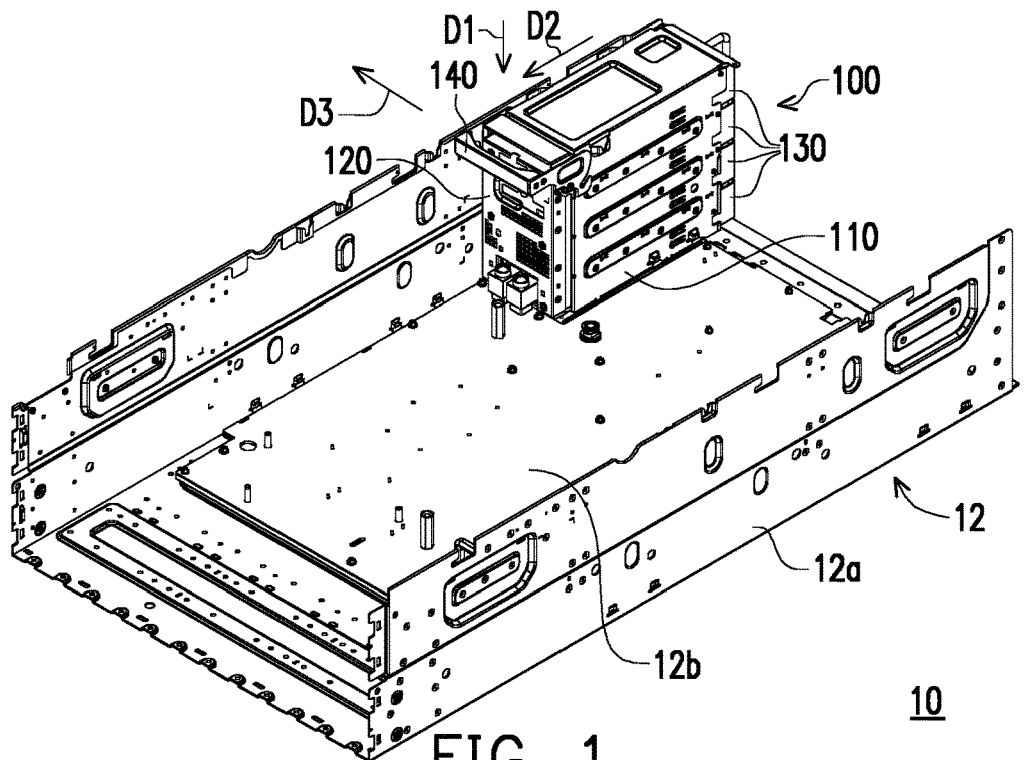
FIG. 1 is a three-dimensional view illustrating some members of a server according to an embodiment of the disclosure.

FIG. 1 is a three-dimensional view illustrating some members of a server according to an embodiment of the disclosure. Referring to FIG. 1, a server 10 of this embodiment includes a server body 12 and a power device 100. The server body 12 includes, for example, a chassis 12a and a main board 12b. The main board 12b is disposed in the chassis 12a. The power device 100 is disposed on the main board 12b and adapted to supply power to the server body 12. For the drawing to be more concise, remaining electronic members on the main board 12b are not illustrated.

Figure 2:
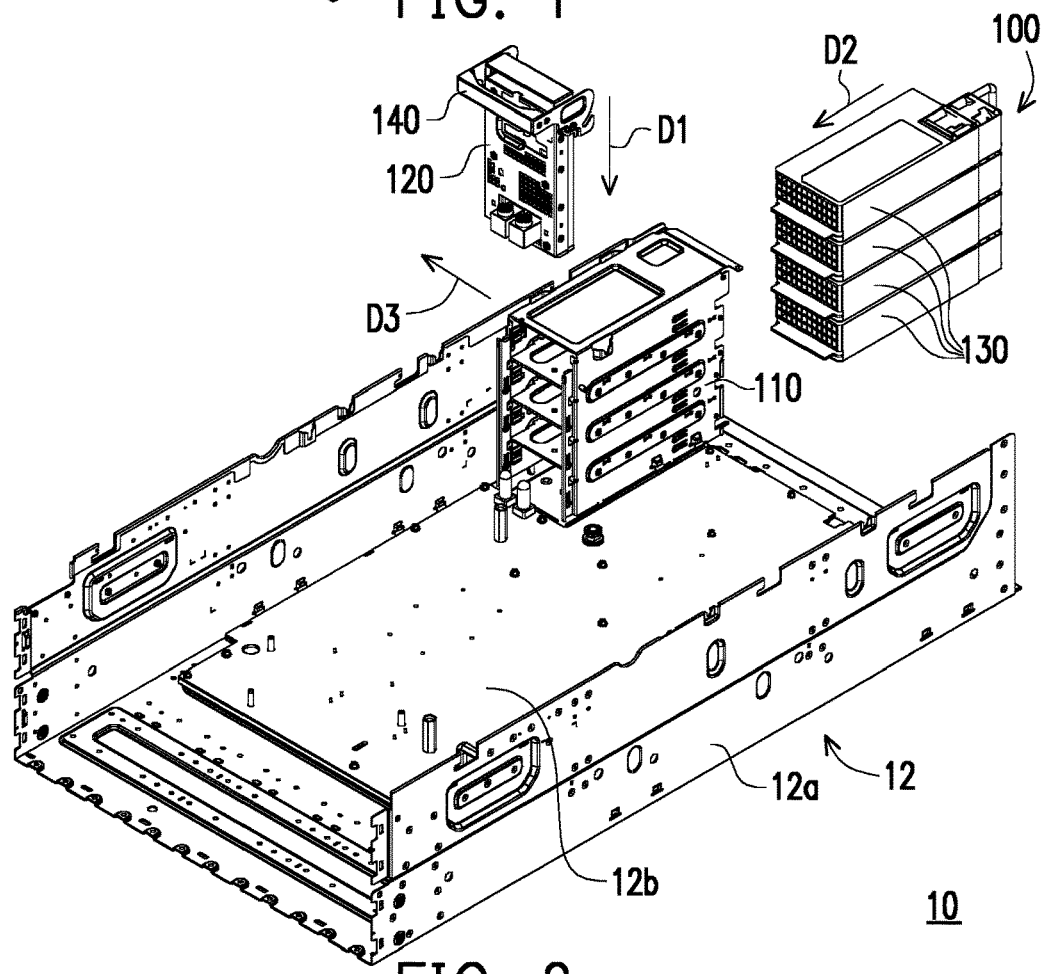
FIG. 2 is a three-dimensional explosive view illustrating some members of the server of FIG. 1.

FIG. 2 is a three-dimensional explosive view illustrating some members of the server of FIG. 1. Referring to FIG. 2, the power device 100 of this embodiment includes a box body 110, a power distribution module 120, and a plurality of power supply modules 130. The box body 110 is disposed on the main board 12b of the server body 12. The power distribution module 120 and the power supply modules 130 are detachably disposed on the box body 110. The power distribution module 120 is adapted to be disposed on the box body 110 along a first direction D1, and each of the power supply modules 130 is adapted to be disposed on the box body 110 along a second direction D2 perpendicular to the first direction D1, and be inserted into the power distribution module 120. In this embodiment, the power supply modules 130 are, for example, sequentially stacked in the box body 110 along the first direction D1 by using a suitable partition structure in the box body 110. In addition, the power distribution module 120 may slide along a front end of the box body 110 in the first direction D1 and be assembled by, for example, using a suitable guiding structure at the front end of the box body 110.

Figure 3:
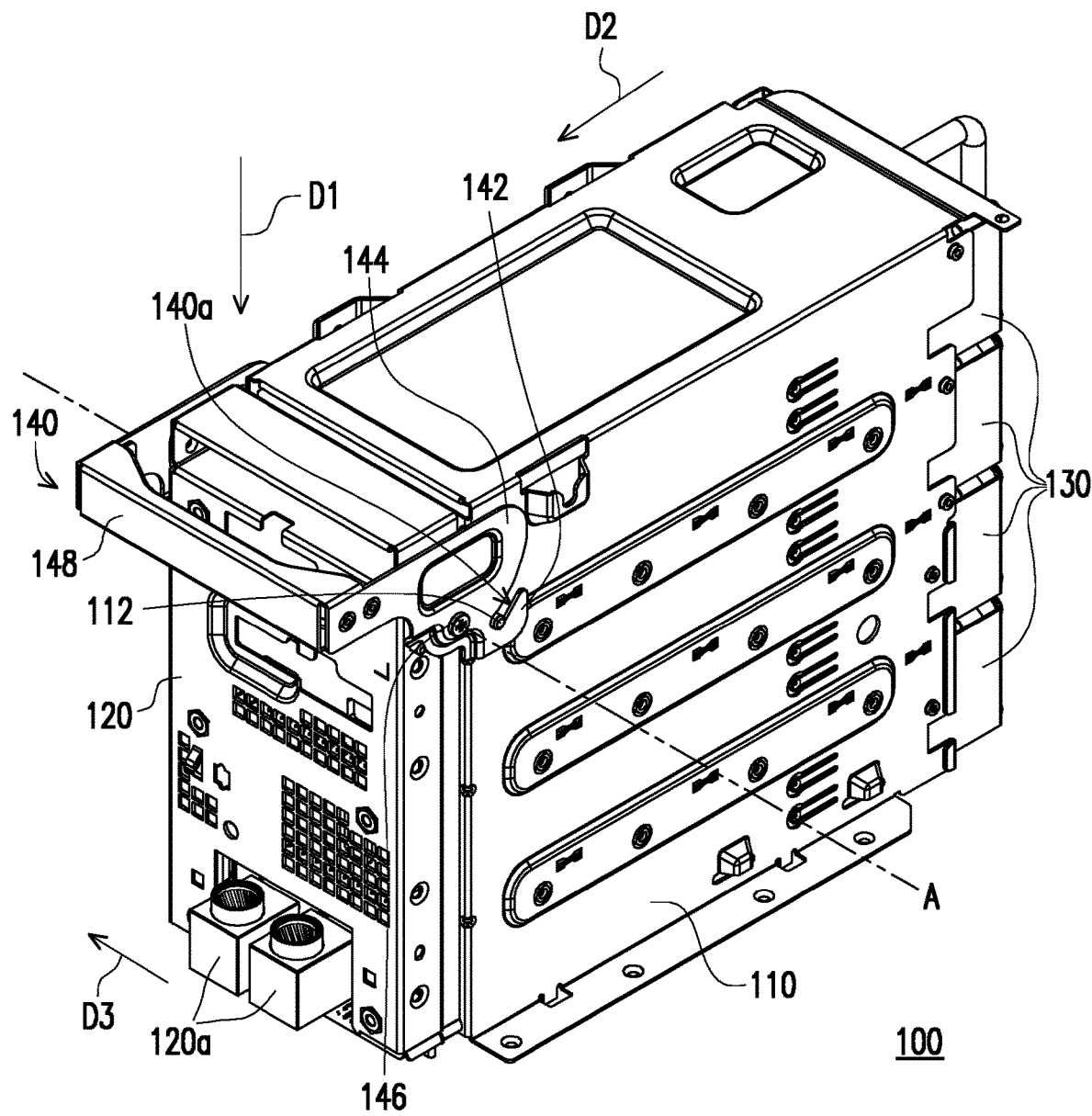
FIG. 3 is a three-dimensional view illustrating a power device of FIG. 1.
Figure 4A:
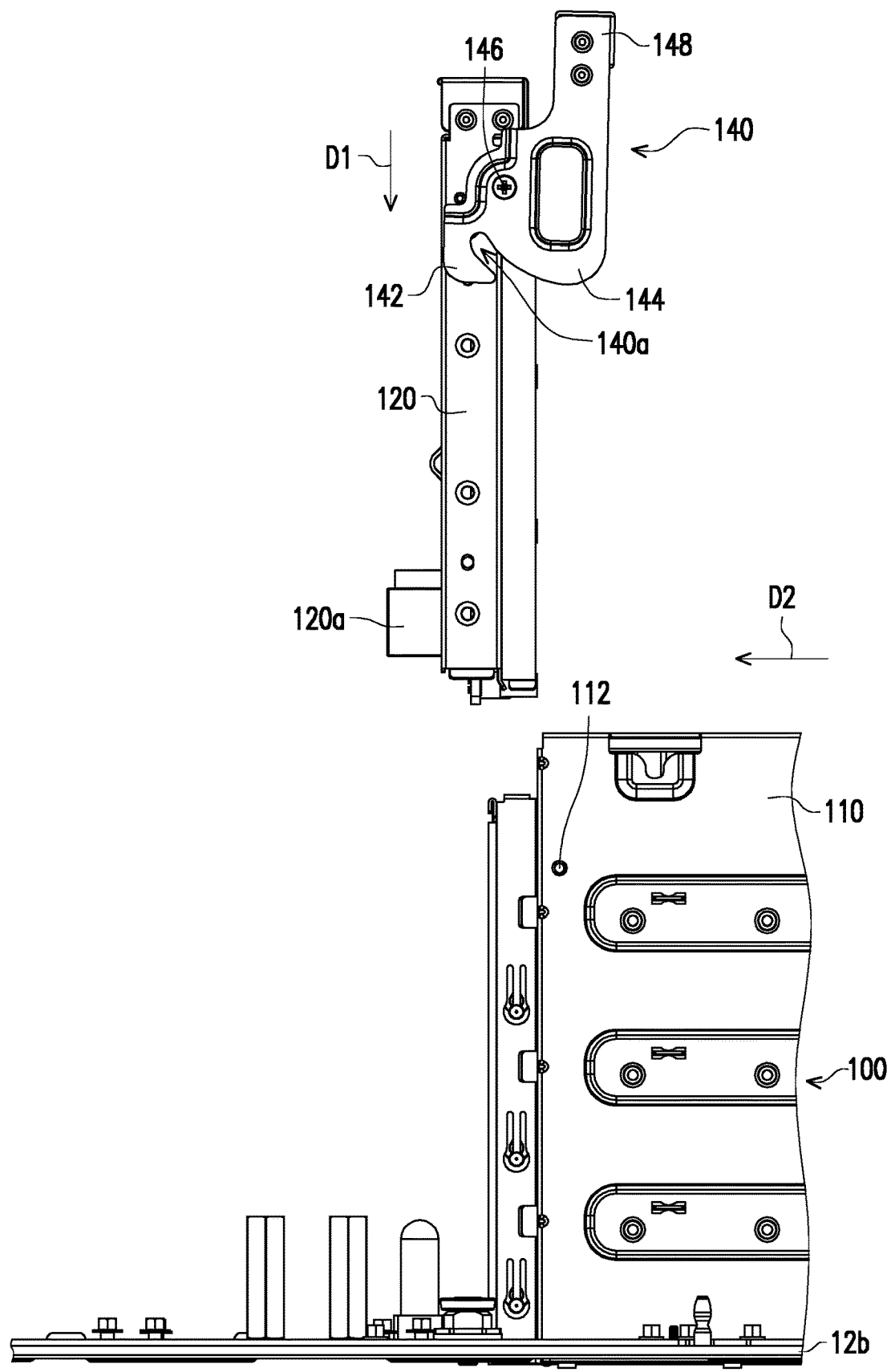
FIGS. 4A-4C are views illustrating processes detaching and installing a power distribution module of FIG. 3.
Figure 4B:
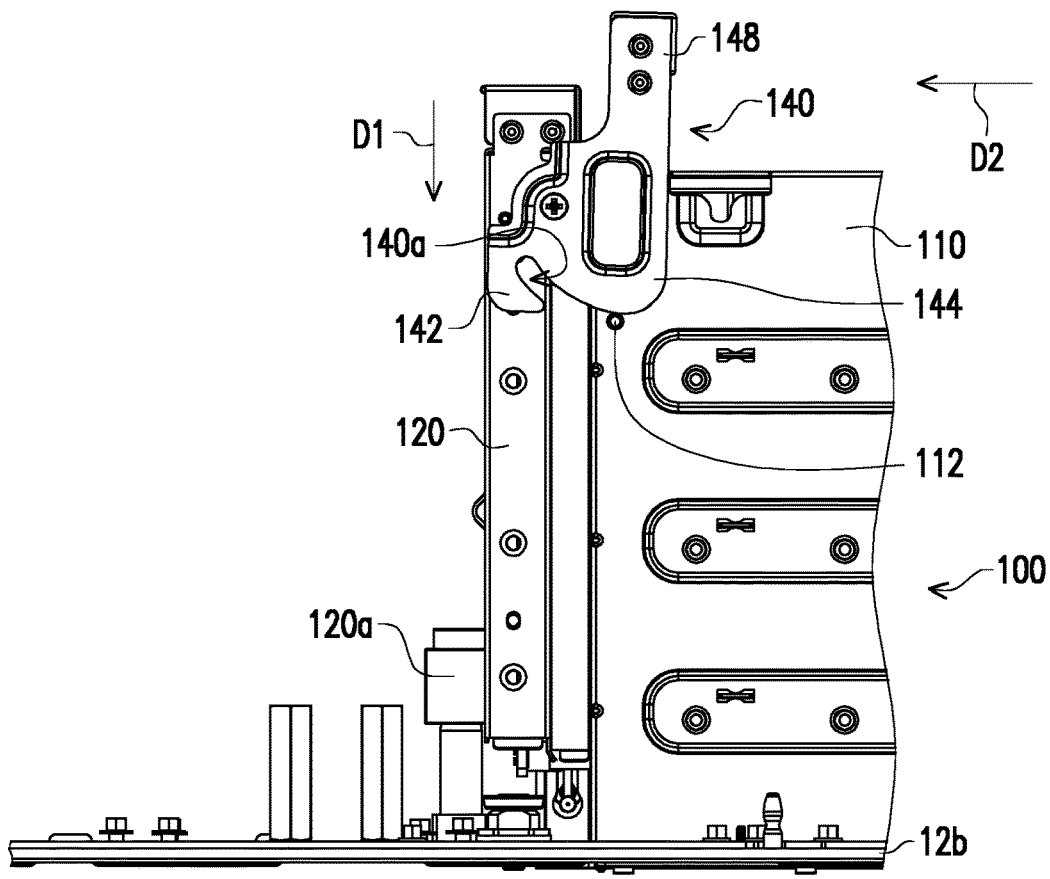
Figure 4C:
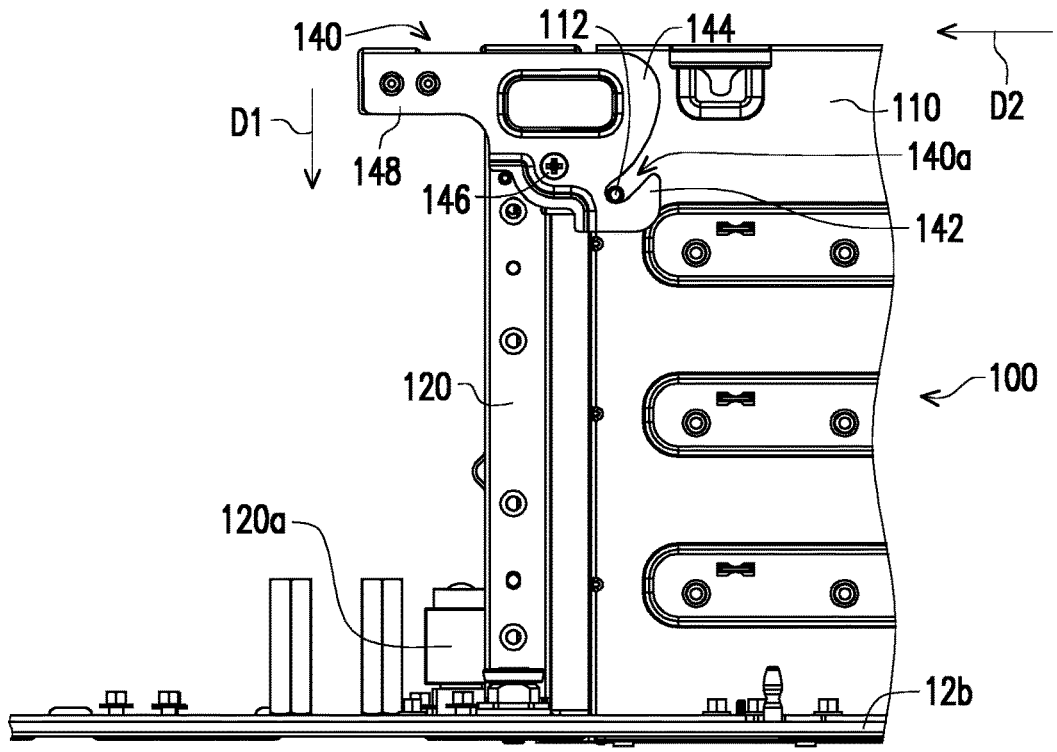

FIG. 3 is a three-dimensional view illustrating the power device of FIG. 1. FIGS. 4A-4C are views illustrating processes detaching and installing a power distribution module of FIG. 3. Referring to FIG. 3, the power device 100 of this embodiment further includes a handle 140. The handle 140 is rotatably connected to the power distribution module 120 about a rotation axis A perpendicular to the first direction D1 and the second direction D2. When the user wants to install the power distribution module 120, the user may move down the power distribution module 120, which separate from the box body 110, shown in FIG. 4A to a position shown in FIG. 4B. Next, the user applies force to the handle 140, so that the handle 140 is rotated from a first state shown in FIG. 4B to a second state shown in FIG. 4C to drive the power distribution module 120 to be installed to the box body 110 along the first direction D1. At this time, a plug portion 120a of the power distribution module 120 is inserted onto the main board 12b of the server body 12. Alternatively, when the user wants to detach the power distribution module 120, the user may apply force to the handle 140, so that the handle 140 is rotated from the second state shown in FIG. 4C to the first state shown in FIG. 4B to drive the power distribution module 120 to be separated from box body 110 along a direction opposite to the first direction D1. Therefore, the power distribution module 120 may be detached from the box body 110 as shown in FIG. 4C.

Figure 5:
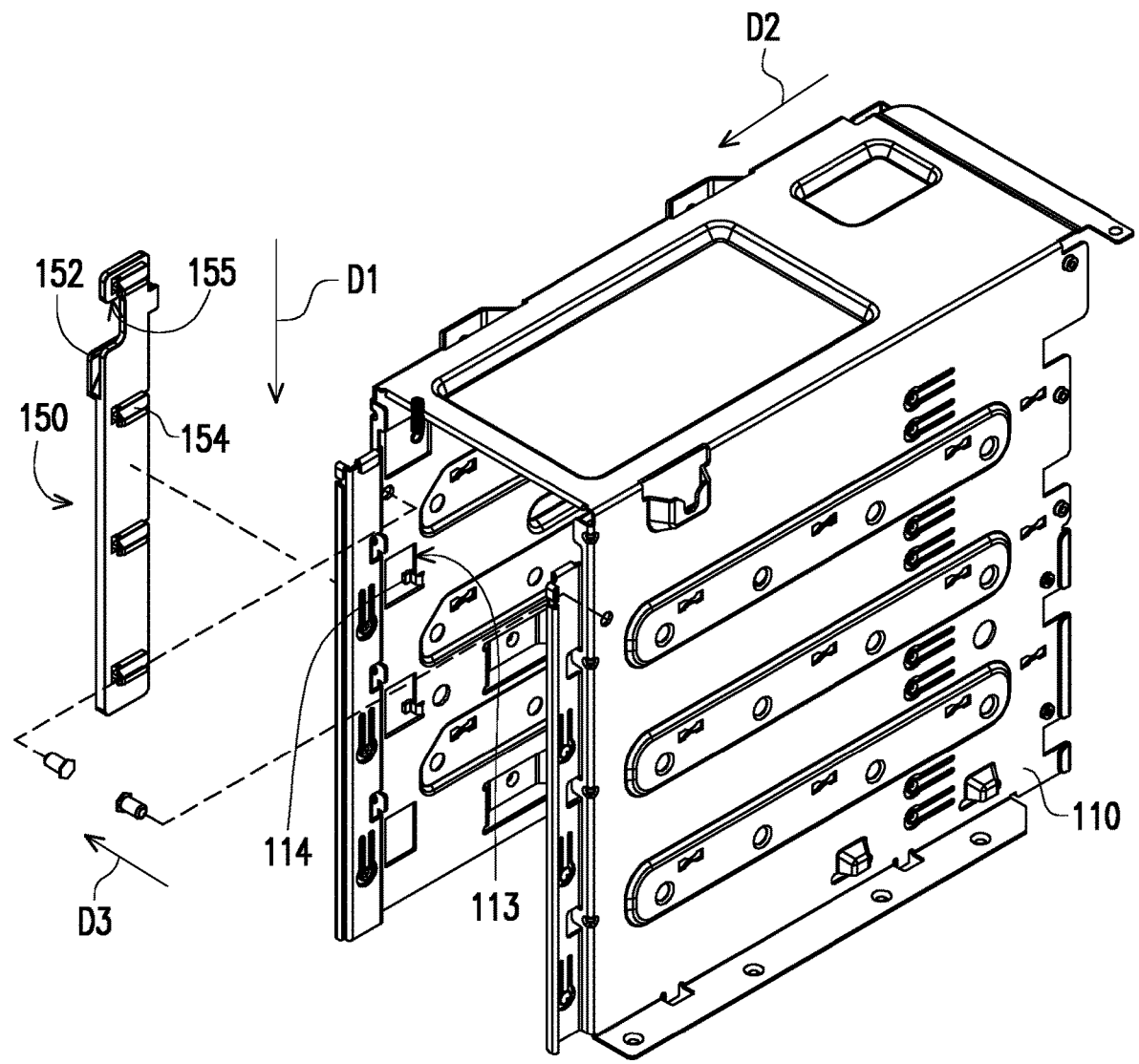
FIG. 5 is an explosive view illustrating some members of FIG. 3.
Figure 6A:
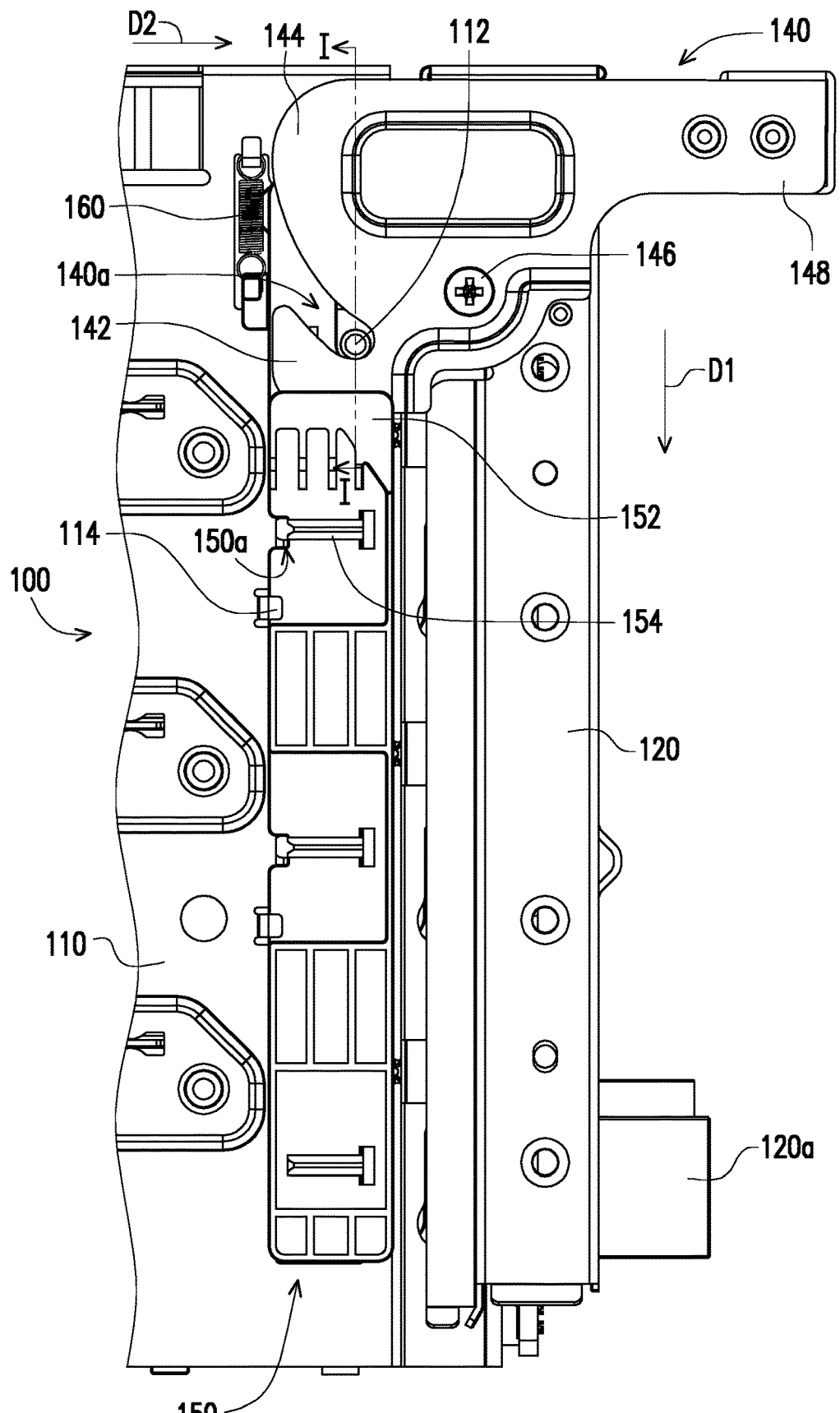
FIG. 6A is a partial side view illustrating the power device of FIG. 3.
Figure 6B:
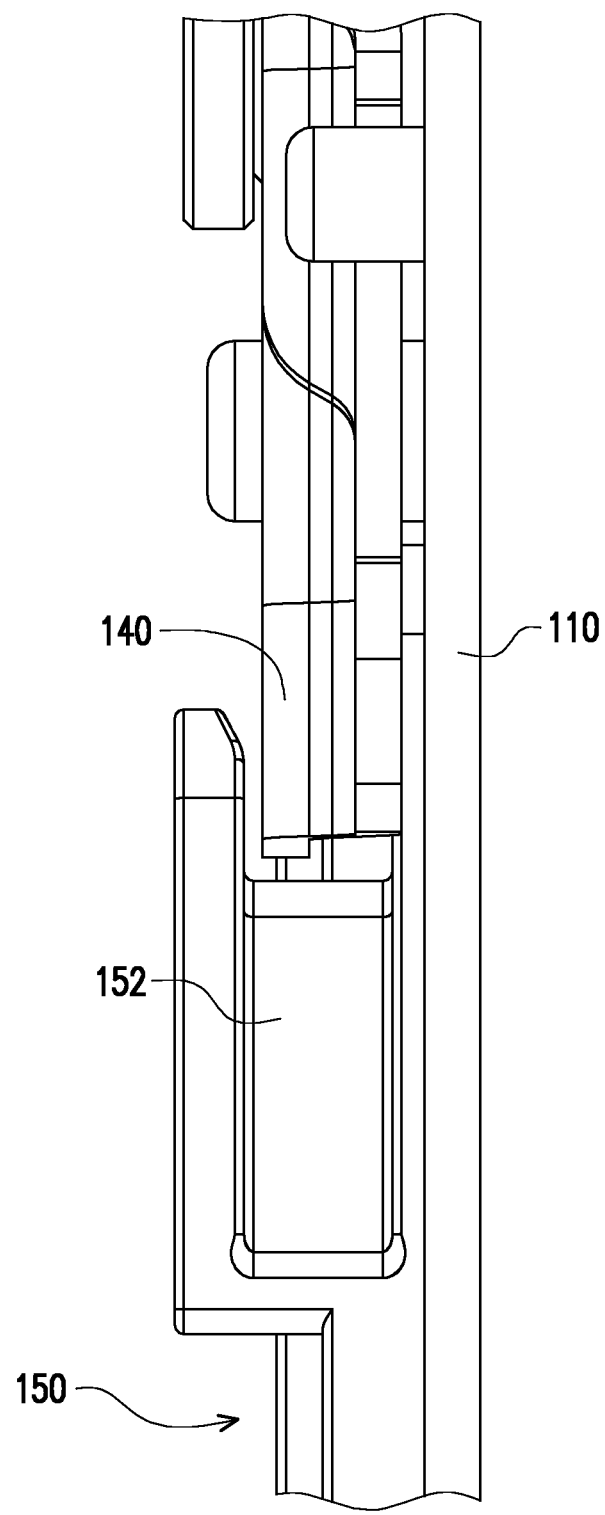
FIG. 6B is a partial front view illustrating the power device of FIG. 6A.
Figure 6C:
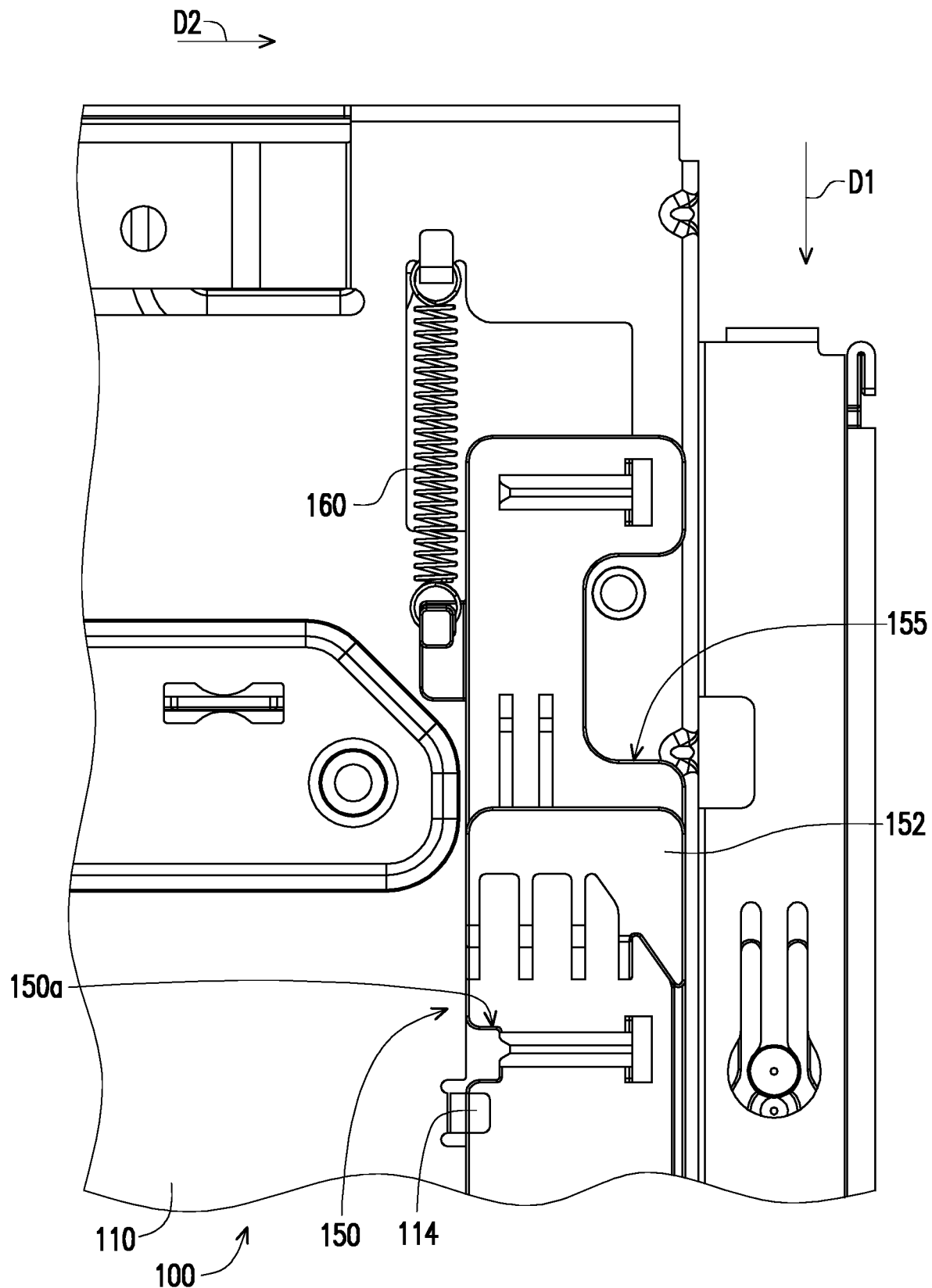
FIG. 6C illustrates a locking member of FIG. 6A moving down.

FIG. 5 is an explosive view illustrating some members of FIG. 3. FIG. 6A is a partial side view illustrating the power device of FIG. 3. FIG. 6B is a partial front view illustrating the power device of FIG. 6A. FIG. 6C shows a locking member of FIG. 6A moving down. For the drawing to be clearer, the power distribution module 120 and the handle 140 are not illustrated in FIG. 6C. Referring to FIGS. 5 and 6A, the power device 100 of this embodiment further includes a locking member 150. The locking member 150 is disposed on the box body 110 by using an elastic member 160. The locking member 150 is movably disposed on the box body 110 along the first direction D1 and is positioned in a first position shown in FIG. 6A by the power supply modules 130 in the box body 110. The locking member 150 in the first position is under a natural state. When the handle 140 is actuated from the first state shown in FIG. 4B to the second state shown in FIG. 4C, the handle 140 pushes a locking portion 152 of the locking member 150, and pushes the locking member 150 from the first position shown in FIG. 6A to the second position shown in FIG. 6C. When the handle 140 is in the second state, the handle 140 is not in contact with the locking member 150 as shown in FIG. 6B, and the locking member 150 returns from the second position to the first position. At this time, the handle 140 is positioned on the box body 110, and the power distribution module 120 is positioned on the main board 12b. The locking portion 152 is a sliding slot adapted to accommodate the handle 140.

When the power distribution module 120 is to be detached after the power supply modules 130 (shown in FIG. 3) are removed, the handle 140 is actuated as described above to return from the second state shown in FIG. 4C to the first state shown in FIG. 4B. The handle 140 is separated from the locking portion 152 of the locking member 150. The locking member 150 is moved from the first position shown in FIG. 6A to the second position shown in FIG. 6C by the elastic member 160 and then reset to the first position, so that the handle 140 is separated from the box body 110 to detach the power distribution module 120. The locking member 150 may be reset by other suitable elastic structures, and the disclosure is not limited thereto.

Figure 7A:
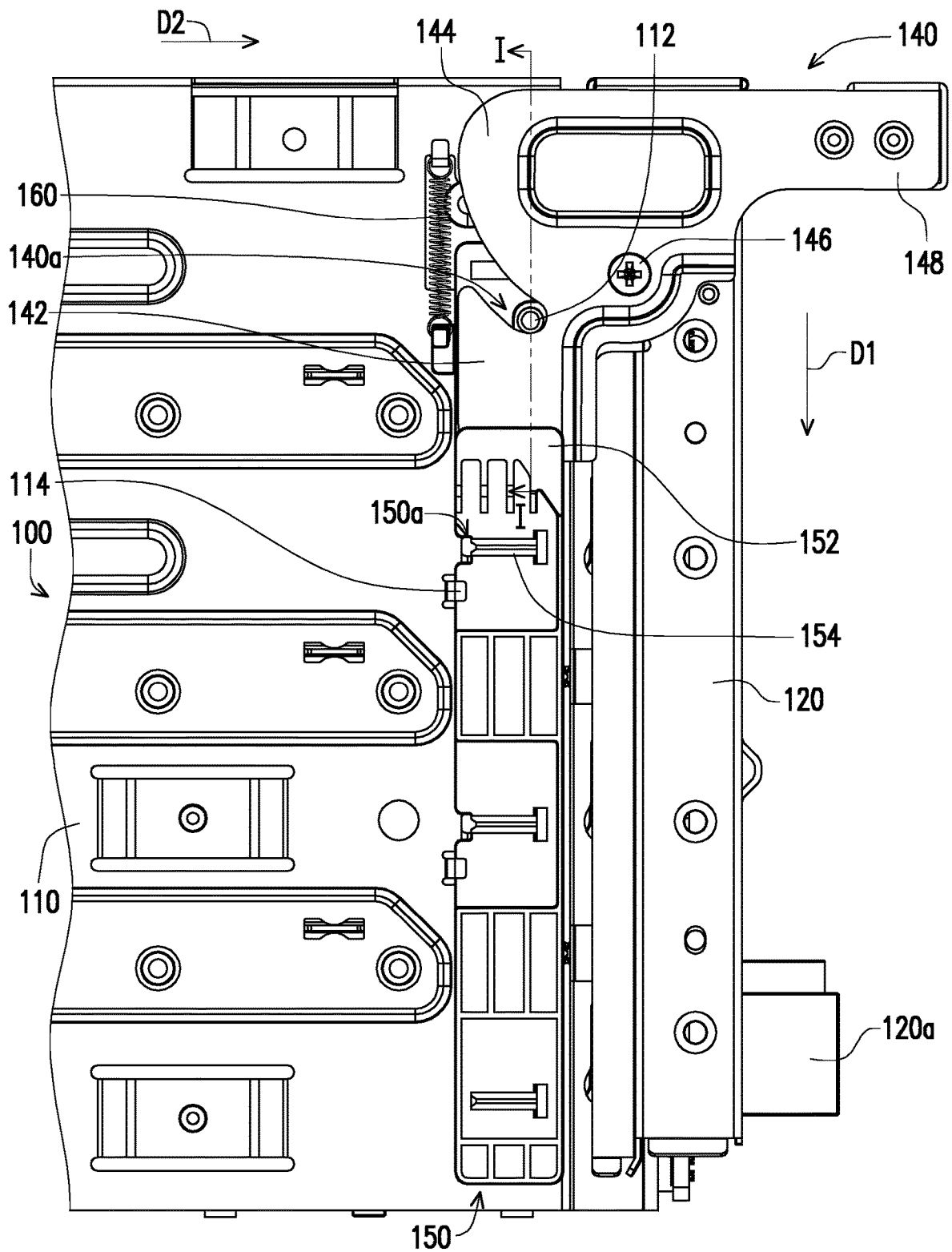
FIG. 7A is a partial side view illustrating a power device according to another embodiment of the disclosure.
Figure 7B:
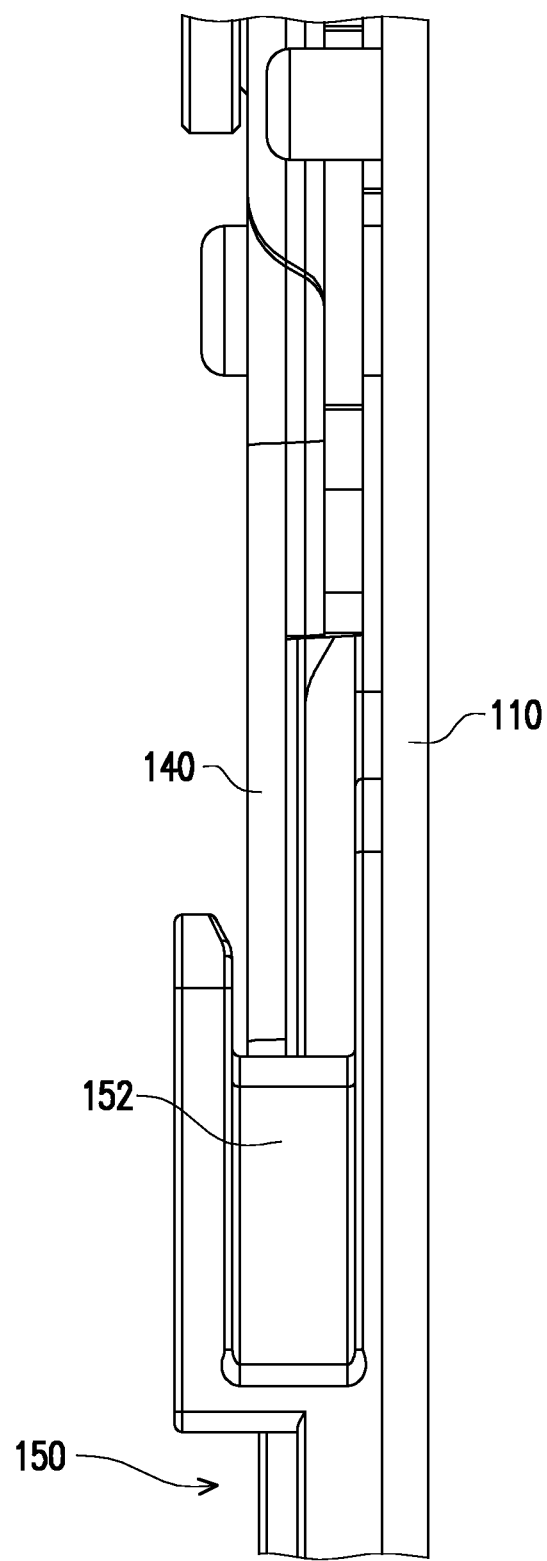
FIG. 7B is a partial front view illustrating the power device of FIG. 7A.
Figure 7C:
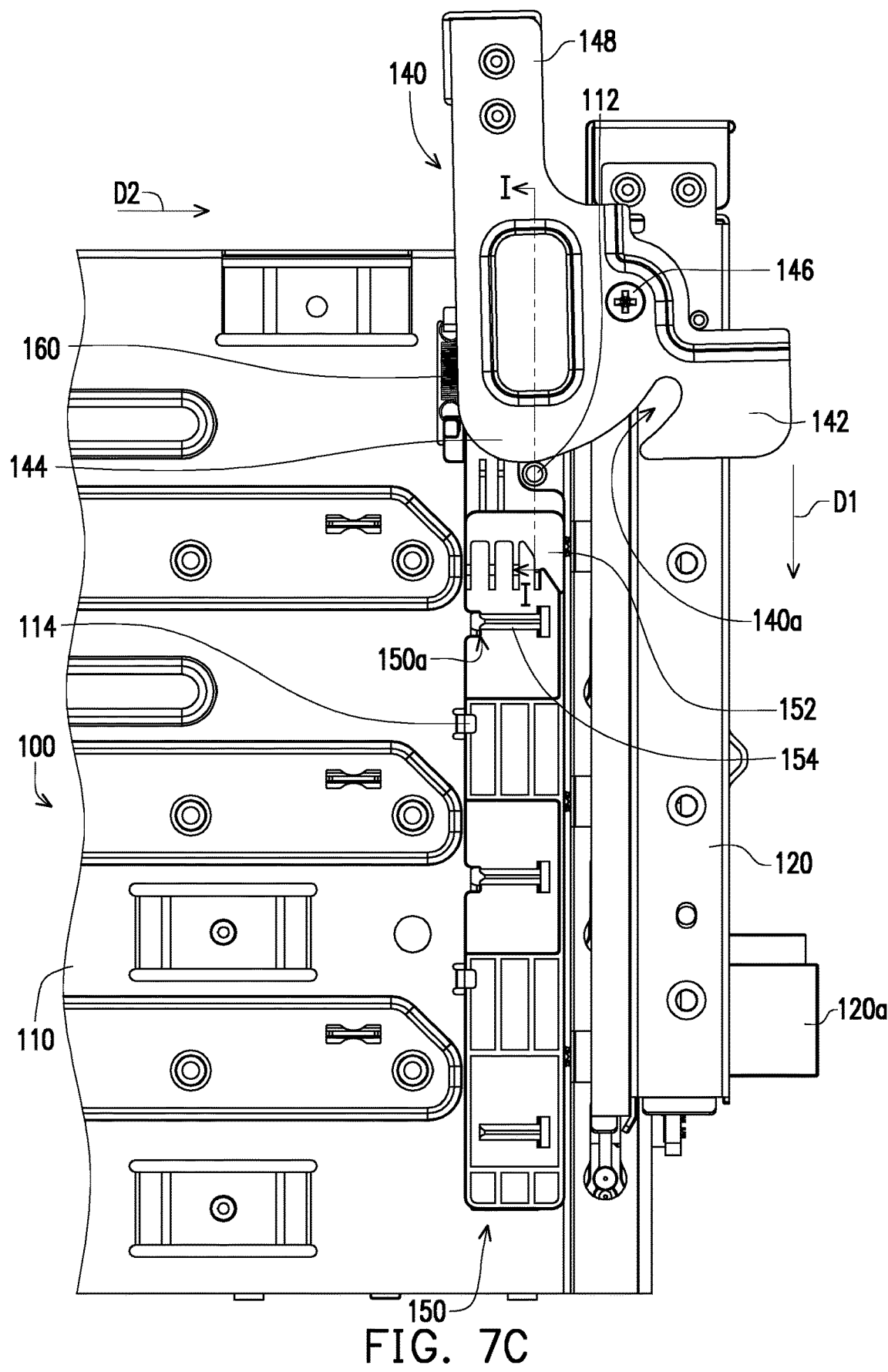
FIG. 7C illustrates a locking member of FIG. 7A moving up.

FIG. 7A is a partial side view illustrating a power device according to another embodiment of the disclosure. FIG. 7B is a partial front view illustrating the power device of FIG. 7A. FIG. 7C illustrates a locking member of FIG. 7A moving up. In another embodiment, when the power distribution module 120 is installed, the handle 140 is rotated to the second state shown in FIG. 7A. The handle 140 is in contact with the locking portion 152 of the locking member 150 as shown in FIG. 7B to cooperate, so that the locking member 150 is moved down from the first position shown in FIG. 7C to the second position shown in FIG. 7A. Accordingly, the handle 140 is positioned on the box body 110, and the power distribution module 120 is positioned on the main board 12*b*. When the power distribution module 120 is to be detached after the power supply modules 130 are removed, the handle 140 returns from the second state shown in FIG. 7A to the first state shown in FIG. 7C, and the locking member 150 is reset from the second position shown in FIG. 7A to the first position shown in FIG. 7C by using the elastic member 160.

As described above, in this embodiment, the handle 140 adapted to detach the power distribution module 120 is disposed on the power distribution module 120 of the power device 100, and the locking member 150 adapted to lock the handle 140 is correspondingly disposed on the box body 110. Under the condition that the power supply modules 130 are disposed on the box body 110, the locking member 150 is positioned by the power supply modules 130 and cannot be moved. Even if the user applies force to the power distribution module 120, the power distribution module 120 remains not actuatable due to the locking of the locking member 150. Consequently, the power distribution module 120 is prevented from being moved to damage the bonding structure between the power supply modules 130 and the power distribution module 120.

Figure 8:
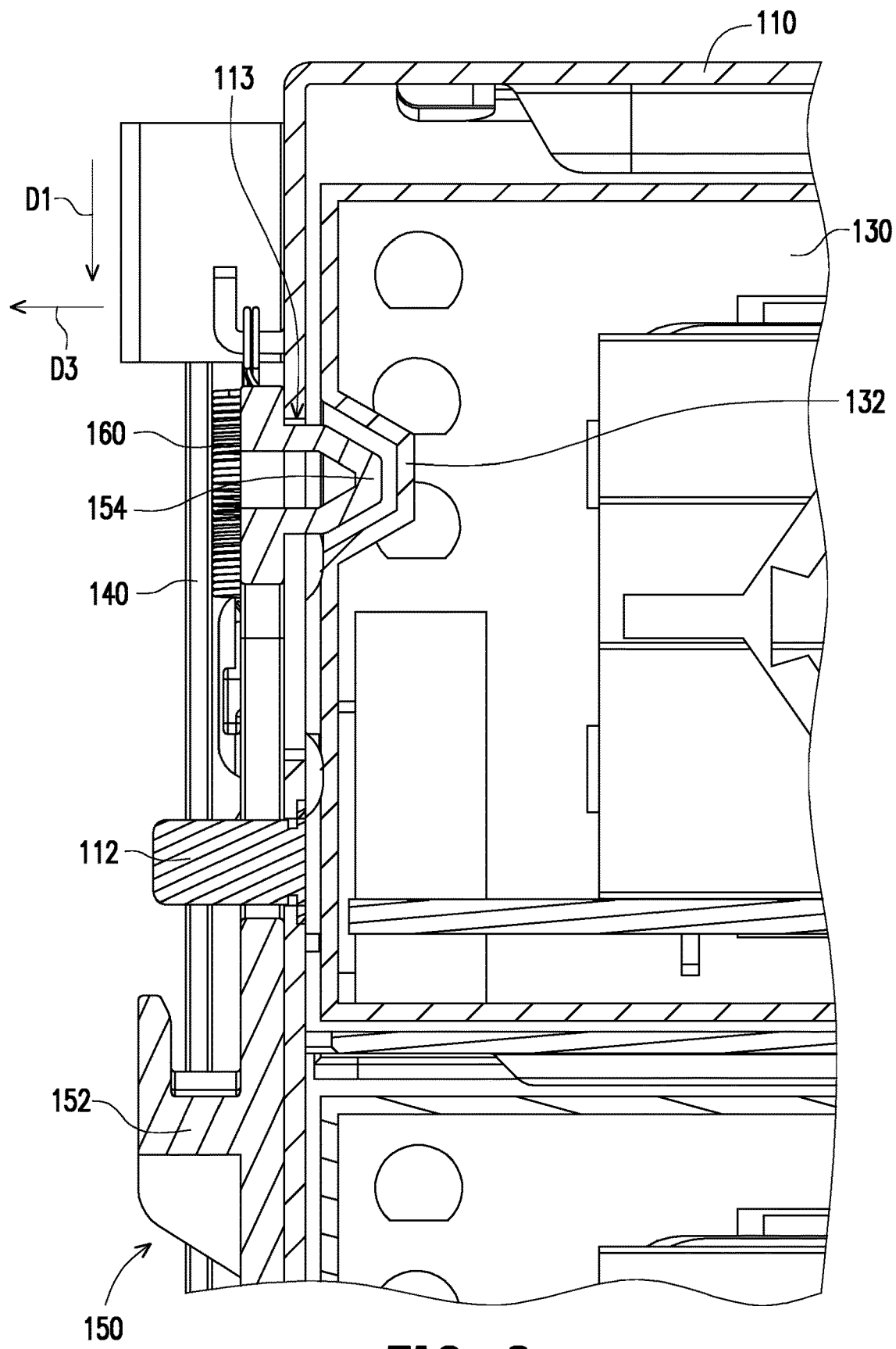
FIG. 8 is a cross-sectional view illustrating the power device of FIG. 6A taken along a line I-I.

Hereinafter, a process with which the power supply modules 130 in this embodiment position the locking member 150 is described in detail. FIG. 8 is a cross-sectional view illustrating the power device of FIG. 6A taken along a line I-I. Referring to FIGS. 5 and 8. In this embodiment, the locking member 150 has a plurality of positioning convex portions 154. The box body has an opening 113. Each of the power supply modules 130 has a positioning concave portion 132. When the locking member 150 is located in the first position shown in FIG. 6A, each of the positioning convex portions 154 of the locking member 150 protrudes through the opening 113 toward the inside of the box body 110, and is positioned to the corresponding positioning concave portion 132 of the power supply module 130. In other embodiments, the power supply module 130 may position the locking member 150 in other suitable ways, and the disclosure is not particularly limited thereto.

Figure 9:
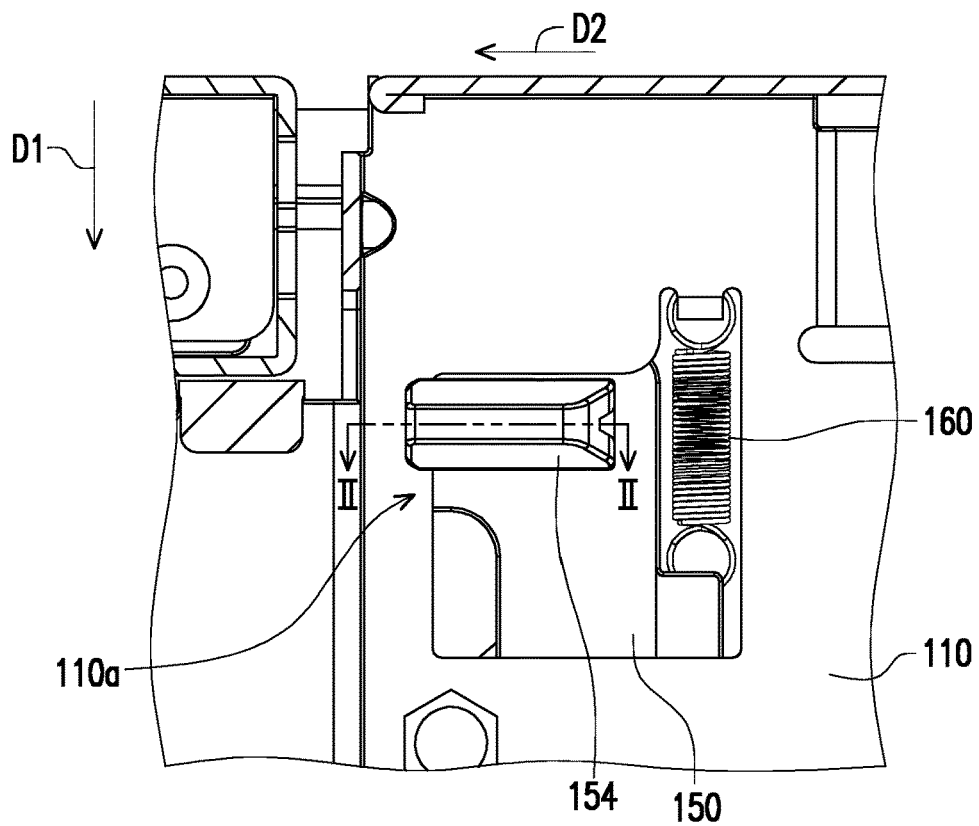
FIG. 9 illustrates a positioning convex portion of a locking member viewed from the inside of a box body.
Figure 10:
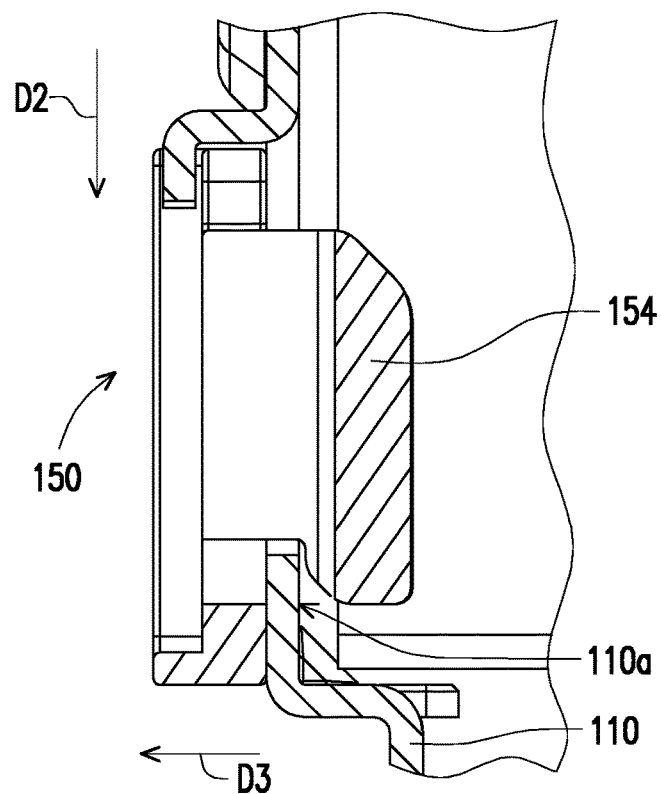
FIG. 10 is a cross-sectional view illustrating a power device of FIG. 9 taken along a line II-II.

FIG. 9 illustrates a positioning convex portion of a locking member viewed from the inside of a box body. FIG. 10 is a cross-sectional view illustrating a power device of FIG. 9 taken along a line II-II. Referring to FIGS. 9 and 10, in this embodiment, each of the positioning convex portions 154 of the locking member 150 is hook-shaped and may mutually stop an inner wall 110*a* of the box body 110 to prevent the locking member 150 from being separated from the box body 110 along a third direction D3 perpendicular to the first direction D1 and the second direction D2. In addition, the box body 110 of this embodiment has a plurality of earrings 114 as shown in FIGS. 5, 6A, and 6C, and the earrings 114 may also prevent the locking member 150 from being moved along the third direction D3.

Figure 11:
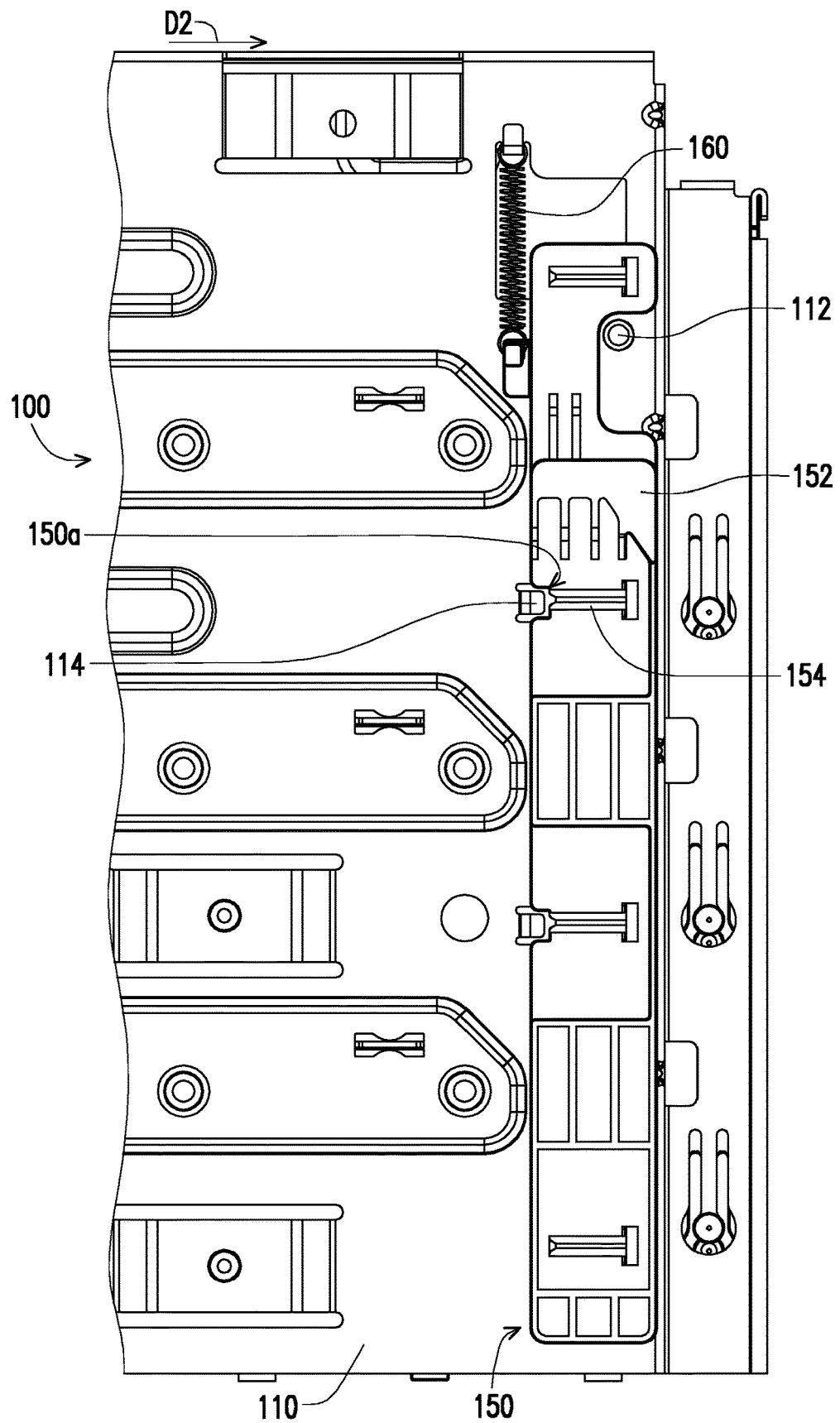
FIG. 11 illustrates a concave of the locking member of FIG. 6C opposite to an earring of the box body.

FIG. 11 illustrates a concave of the locking member of FIG. 6C aligned to an earring of the box body. Furthermore, the locking member 150 of this embodiment has a plurality of concaves 150*a* as shown in FIGS. 6A and 6C. When the locking member 150 is assembled to the box body 110, the locking member 150 may be first moved to a third position as shown in FIG. 11. The second position shown in FIG. 6C is located between the first position shown in FIG. 6A and the third position shown in FIG. 11. At this time, the concave 150*a* of the locking member 150 is aligned to the earring 114 of the box body 110. The locking member 150 is not stopped by the earring 114, and may move in a direction opposite to the third direction D3 (marked in FIGS. 8 and 10), so that the positioning convex portion 154 of the locking member 150 extends into the box body 110. Next, the locking member 150 is moved up to the first position shown in FIG. 6A or the second position shown in FIG. 6C, and the elastic member 160 is connected between the locking member 150 and the box body 110 to complete the assembling of the locking member 150.

Hereinafter, the operation of the handle 140 of this embodiment is described in detail. Referring to FIGS. 3, 4A, and 6A, the box body 110 of this embodiment has at least one pillar portion 112. The handle 140 has at least one hooking portion 142 and at least one pushing portion 144. The locking member 150 has a slot 155 (marked in FIG. 6C) and accommodates the pillar portion 112 of the handle 140. When the handle 140 is in the first state shown in FIG. 4B, the pushing portion 144 of the handle is in contact with the pillar portion 112, but the hooking portion 142 is far away from the pillar portion 112. At this time, the locking member 150 is located at the first position, and the pillar portion 112 abuts against one end of the slot 155 close to the locking portion 152. When the handle 140 is actuated from the first state shown in FIG. 4B to the second state shown in FIG. 4C, the hooking portion 142 is in contact with the pillar portion 112 and pushes the locking portion 152. At this time, the locking member 150 is actuated from the first position to the second position. The pillar portion abuts against the other end of the slot 155 away from the locking portion 152. When the handle 140 is in the second state, the hooking portion 142 is hooked to the pillar portion 112 to position the handle 140, but the hooking portion 142 is not in contact with the locking portion 152. The locking member 150 is moved from the second position to the first position. At this time, the power distribution module 120 is positioned to the box body 110.

When the handle 140 and the power distribution module 120 are to be separated from the box body 110, the handle is actuated from the second state shown in FIG. 4C to the first state shown in FIG. 4B. The pushing portion 144 of the handle 140 pushes the pillar portion 112 of the box body 110, and the hooking portion 142 is away from the locking portion 152 of the locking member 150. At this time, the locking member 150 is moved from the first position to the second position and then reset back to the first position.

In another embodiment, when the handle is in the second state shown in FIG. 7A, the hooking portion 142 is hooked with the pillar portion 112 and in contact with the locking portion 152 as shown in FIG. 7B. At this time, the pillar portion 112 abuts against the end of the slot 155 close to the locking portion 152.

In this embodiment, the pushing portion 144 of the handle 140 has an arc-shaped edge and is adapted to push the pillar portion 112 by the arc-shaped edge. Therefore, the pushing portion 144 is smoothly actuated through the guidance of the arc-shaped edge. Furthermore, a guiding slot 140*a* is formed between the hooking portion 142 and at least a portion of the arc-shaped edge of the pushing portion 144. The hooking portion 142 is adapted to be hooked to the pillar portion 112 by the guiding slot 140*a*.

In addition, the handle 140 of this embodiment has a pivot portion 146 and a force applying portion 148. The handle 140 is rotatably connected to the power distribution module 120 through the pivot portion 146, and is adapted to be actuated between the first state and the second state by the force applied by the user to the force applying portion 148. A distance between the force applying portion 148 and the pivot portion 146 is greater than a distance between the pillar portion 112 and the pivot portion 146, so that when the user pulls the handle 140, there is a labor-saving effect by a greater moment arm between the force applying portion 148 and the pivot portion 146.

Figure 12A:
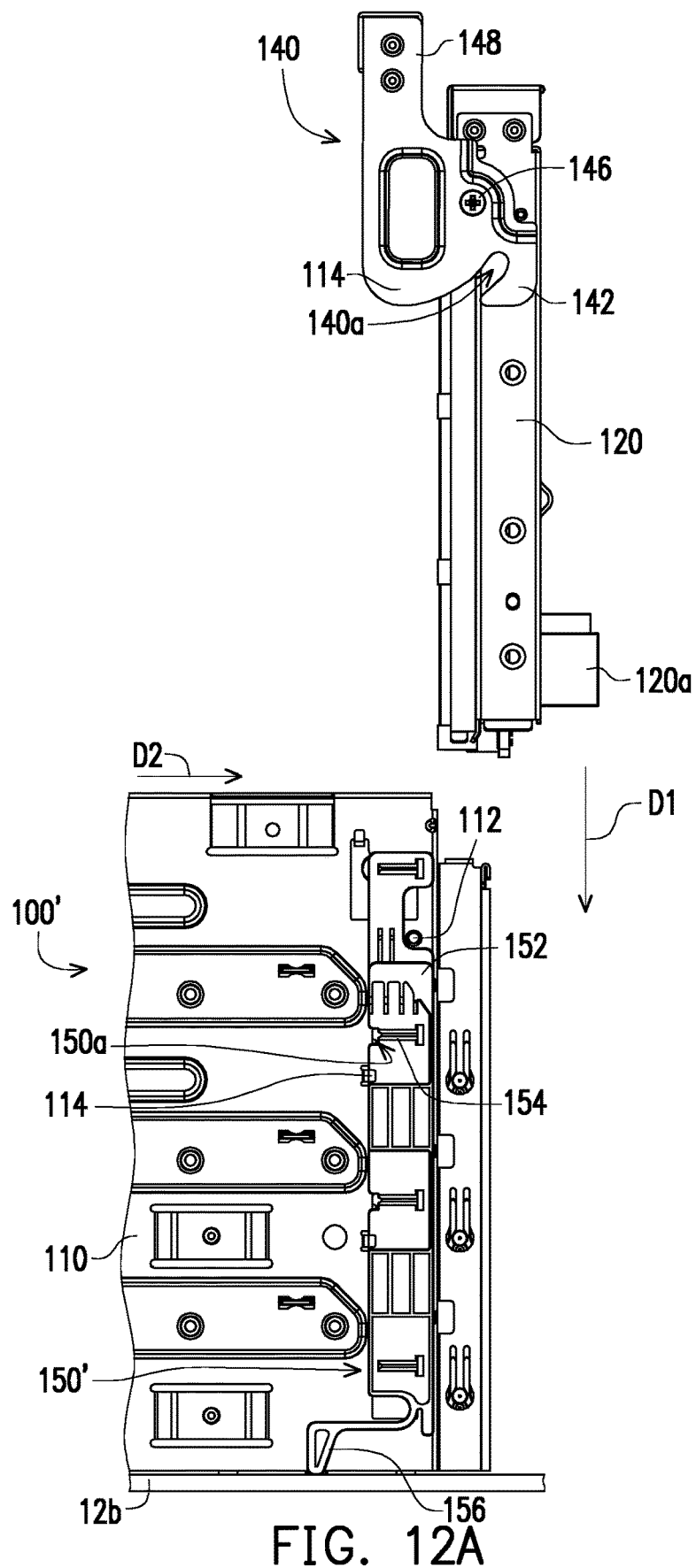
FIGS. 12A-12C are views illustrating processes of actuation of a locking member according to another embodiment of the disclosure.
Figure 12B:
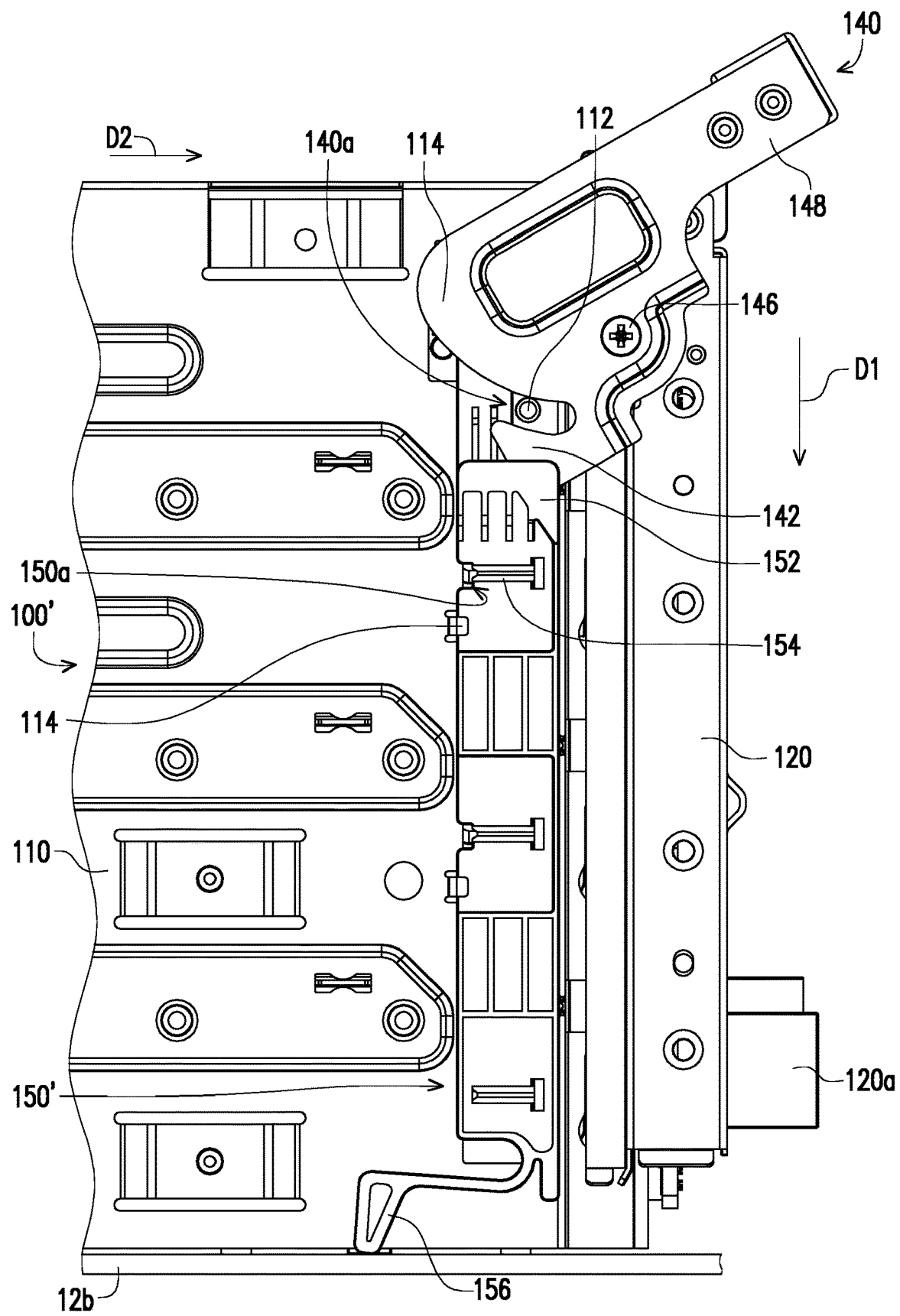
Figure 12C:
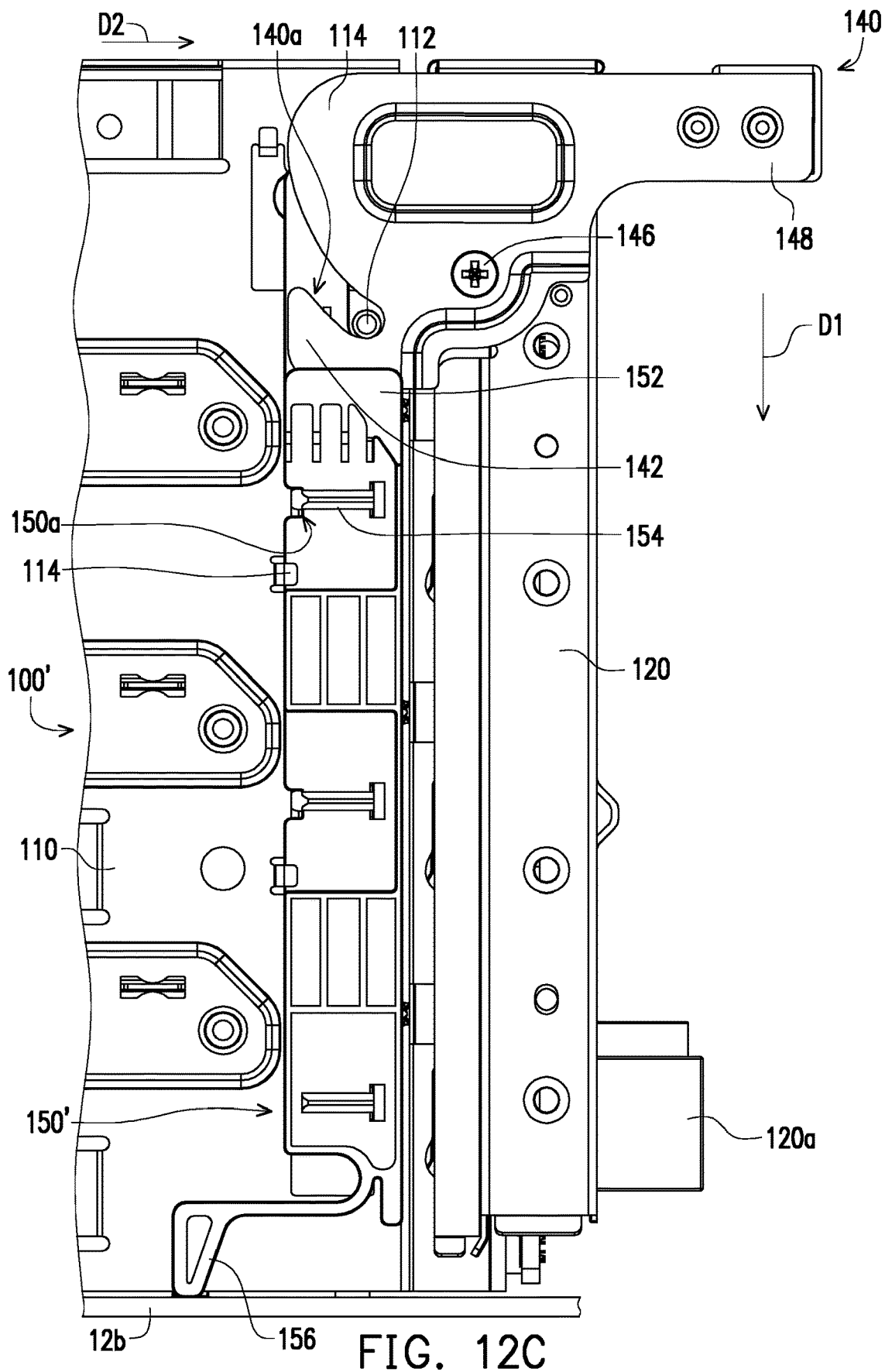

FIGS. 12A-12C are views illustrating processes of actuation of a locking member according to another embodiment of the disclosure. The difference between the embodiment shown in FIGS. 12A-12C and the foregoing embodiment is that a power device 100' of FIGS. 12A-12C does not include the elastic member 160 of the foregoing embodiment. An elastic member 156 of the power device 100' is an elastic arm and is connected to an end of a locking member 150'. When the handle 140 is in the first state, and the locking member 150' is in the first position shown in FIG. 12A, the elastic member 156 is in a natural state. When the handle 140 is moved down from the position shown in FIG. 12A and actuated from the first state to the second state as shown in FIGS. 12A-12C, the locking member 150' is driven to move from the first position shown in FIG. 12A to the second position shown in FIG. 12B. At this time, the locking member 150' presses the elastic member 156, so that the elastic member 156 is deformed and accumulates elastic potential energy. When the handle 140 is positioned in the second state shown in FIG. 12C, the elastic member 156 releases the elastic potential energy, so that the locking member 150' is reset from the second position shown in FIG. 12B to the first position shown in FIG. 12C by elastic force of the elastic member 156.

When the handle 140 and the power distribution module 120 are to be separated from the box body 110, the handle 140 is actuated from the second state to the first state, and the locking member 150' is moved from the first position to the second position and then reset back to the first position. At this time, the handle 140 drives the power distribution module 120 away from the main board 12*b*.

Figure 13A:
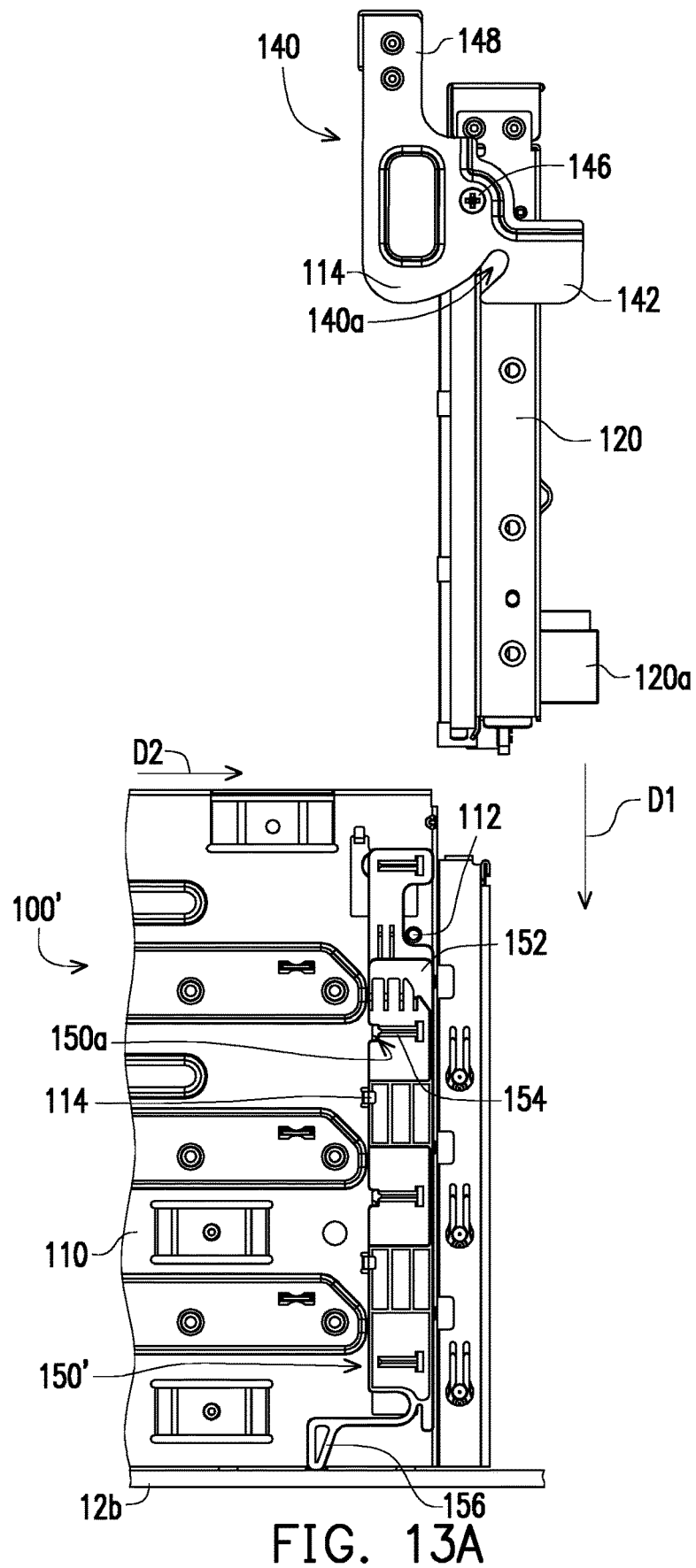
FIGS. 13A and 13B are views illustrating processes of actuation of a power device according to another embodiment of the disclosure.
Figure 13B:
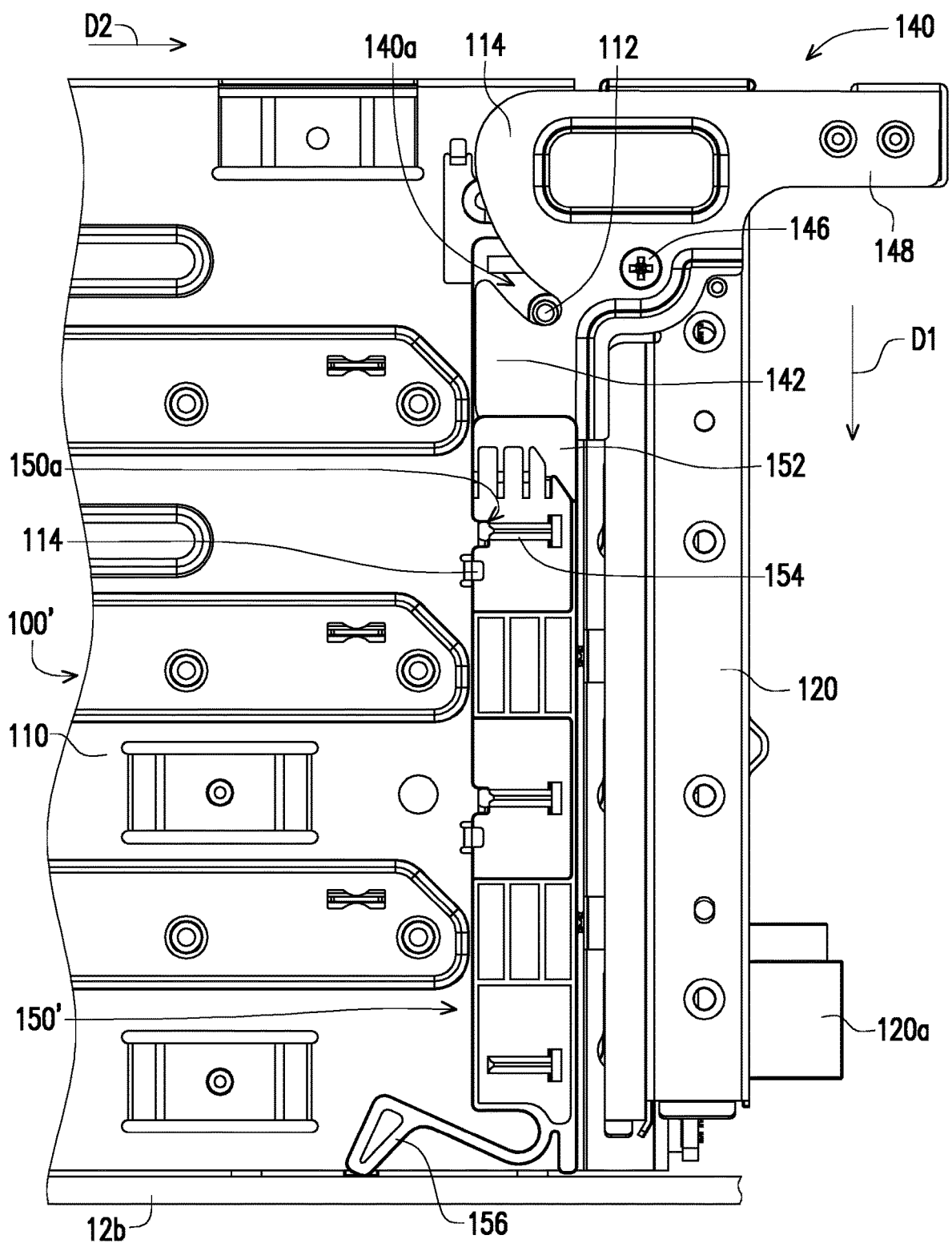

FIGS. 13A and 13B are views illustrating processes of actuation of a power device according to another embodiment of the disclosure. In another embodiment, when the handle 140 is positioned in the second state as shown in FIG. 13B, the locking member 150' is in the second position. When the handle is moved from the second state to the first state, the locking member 150' is reset from the second position shown in FIG. 13B to the first position shown in FIG. 13A by releasing the elastic potential energy of the elastic member 156.

What is claimed is:

1. A power device, comprising:
a box body;
a power distribution module, detachably disposed on the box body;
at least one power supply module, detachably disposed on the box body and detachably connected to the power distribution module;
a handle, rotatably and directly connected to the power distribution module and adapted to detachably connect the power distribution module to the box body; and
a locking member, movably disposed on the box body and adapted to cooperate with the handle to position the power supply module, wherein the locking member is configured to be directly positioned to the at least one power supply module.

2. The power device according to claim 1, wherein the handle is actuated from a first state to a second state to drive the power distribution module to be connected to the box body, and the locking member is reset to a first position after the handle pushes the locking member from the first position to a second position.

3. The power device according to claim 1, wherein the handle is actuated from a first state to a second state to drive the power distribution module to be connected to the box body, and the handle pushes the locking member from a first position to a second position to position the power supply module.

4. The power device according to claim 3, further comprising an elastic member, wherein the elastic member connects the locking member to the box body, and the locking member is adapted to be reset from the second position to the first position by elastic force of the elastic member.

5. The power device according to claim 4, wherein the elastic member is a spring and is connected between the box body and the locking member.

6. The power device according to claim 4, wherein the elastic member is an elastic arm and is connected to an end of the locking member.

7. The power device according to claim 1, wherein the locking member has at least one positioning convex portion, the at least one power supply module has a positioning concave portion, and the at least one positioning convex portion of the locking member is adapted to extend toward an inside of the box body and be positioned on the positioning concave portion of the at least one power supply module, the at least one positioning convex portion cooperates with the box body to stop the locking member from being separated from the box body.

8. The power device according to claim 1, wherein the box body has at least one pillar portion, the handle has at least one hooking portion and at least one pushing portion, and the at least one pushing portion is adapted to push the at least one pillar portion, so that the at least one hooking portion is hooked with the at least one pillar portion to position the power distribution module to the box body.

9. The power device according to claim 8, wherein the at least one pushing portion has an arc-shaped edge and is adapted to push the at least one pillar portion by the arc-shaped edge.

10. The power device according to claim 9, wherein a guiding slot is formed between the hooking portion and at least a portion of the arc-shaped edge, and the hooking portion is adapted to be hooked to the pillar portion through guidance of the guiding slot.

11. A server, comprising:
a server body; and
a power device, comprising:
a box body, disposed on the server body;
a power distribution module, detachably disposed on the box body;

at least one power supply module, detachably disposed on the box body and detachably connected to the power distribution module;

a handle, rotatably and directly connected to the power distribution module and adapted to detachably connect the power distribution module to the box body; and a locking member, movably disposed on the box body and adapted to cooperate with the handle to position the power supply module, wherein the locking member is configured to be directly positioned to the at least one power supply module.

12. The server according to claim 11, wherein the handle is actuated from a first state to a second state to drive the power distribution module to be connected to the box body, and the locking member is reset to a first position after the handle pushes the locking member from the first position to a second position.

13. The server according to claim 11, wherein the handle is actuated from a first state to a second state to drive the power distribution module to be connected to the box body, and the handle pushes the locking member from a first position to a second position to position the power supply module.

14. The server according to claim 13, wherein the power device further comprises an elastic member, the elastic member is connected to the locking member, and the locking member is adapted to be reset from the second position to the first position by elastic force of the elastic member.

15. The server according to claim 14, wherein the elastic member is a spring and is connected between the box body and the locking member.

16. The server according to claim 14, wherein the elastic member is an elastic arm and is connected to an end of the locking member.

17. The server according to claim 11, wherein the locking member has at least one positioning convex portion, the at least one power supply module has a positioning concave portion, and the at least one positioning convex portion of the locking member is adapted to extend toward an inside of the box body and be positioned on the positioning concave portion of the at least one power supply module, wherein the at least one positioning convex portion cooperates with the box body to stop the locking member from being separated from the box body.

18. The server according to claim 11, wherein the box body has at least one pillar portion, the handle has at least one hooking portion and at least one pushing portion, and the at least one pushing portion is adapted to push the at least one pillar portion, so that the at least one hooking portion is hooked with the at least one pillar portion to position the power distribution module to the box body.

19. The server according to claim 18, wherein the at least one pushing portion has an arc-shaped edge and is adapted to push the at least one pillar portion by the arc-shaped edge.

20. The server according to claim 19, wherein a guiding slot is formed between the hooking portion and at least a portion of the arc-shaped edge, and the hooking portion is adapted to be hooked to the pillar portion through guidance of the guiding slot.

* * * * *